(12) United States Patent
Mouli

(10) Patent No.: US 7,446,351 B2
(45) Date of Patent: Nov. 4, 2008

(54) TRANSISTOR STRUCTURES AND TRANSISTORS WITH A GERMANIUM-CONTAINING CHANNEL

(75) Inventor: Chandra Mouli, Boise, ID (US)

(73) Assignee: Micron technology, Inc., Boise, ID (US)

( * ) Notice: Subject to any disclaimer, the term of this patent is extended or adjusted under 35 U.S.C. 154(b) by 0 days.

(21) Appl. No.: 11/497,701

(22) Filed: Aug. 1, 2006

(65) Prior Publication Data

US 2006/0266995 A1 Nov. 30, 2006

Related U.S. Application Data

(63) Continuation of application No. 10/882,563, filed on Jun. 30, 2004, now Pat. No. 7,151,285.

(51) Int. Cl.
*H01L 29/772* (2006.01)

(52) U.S. Cl. .................. 257/192; 257/288; 257/E29.27

(58) Field of Classification Search ............ 257/19, 257/E29.27
See application file for complete search history.

(56) References Cited

U.S. PATENT DOCUMENTS

| 5,461,250 | A | 10/1995 | Burghartz et al. |
| 6,350,993 | B1 | 2/2002 | Chu et al. |
| 6,458,662 | B1 | 10/2002 | Yu |
| 6,503,783 | B1 | 1/2003 | Mouli |
| 6,593,191 | B2 | 7/2003 | Fitzgerald |

OTHER PUBLICATIONS

Dr. Thomas Hackbarth, Dipl. Ing., et al., "The Future of SiGe Beyond HBT Applications", Unaxis Chip, Jul. 2002, pp. 32-35.
C.H. Lee, et al., "Self-Aligned Ultra Thin $HfO_2$ CMOS Transistors with High quality CVD TaN Gate Electrode", 2002 IEEE Symposium on VLSI Technology, Digest of Technical Papers, pp. 82-83.
Minjoo L. Lee, et al., "Strained Ge Channel P-Type Metal-Oxide-Semiconductor Field-Effect Transistors Grown on $Si_{1-x}Ge_x$/Si Virtual Substrates", Applied Physics Letters, vol. 79, No. 20, Nov. 12, 2001, pp. 3344-3346.

(Continued)

*Primary Examiner*—Lex Malsawma
(74) *Attorney, Agent, or Firm*—Wells St. john P.S.

(57) ABSTRACT

A transistor structure includes a first undoped, silicon-containing channel layer, a buried germanium channel, and a second undoped, silicon-containing channel layer. The first and second channel layers may contain SiGe or, alternatively, Si only. Another transistor structure includes a first channel layer, a buried germanium channel, and a second, undoped channel layer containing silicon and germanium over the buried channel. A further transistor structure includes a first channel layer, a buried germanium channel, and a second channel layer containing compositionally graded SiGe over the buried channel. A still further transistor structure includes a first silicon layer, an undoped or homogeneously doped buried channel containing silicon and germanium, and a second silicon layer over the buried channel.

17 Claims, 4 Drawing Sheets

OTHER PUBLICATIONS

C.W. Leitz, et al, Hole "Mobility Enhancements in Strained Si/$Si_{1-y}Ge_y$ P-Type Metal-Oxide-Semiconductor Field-Effect Transistors Grown on Relaxed $Si_{1-x}Ge_x$ (x<y) Virtual Substrates", Applied Physics Letters, vol. 79, No. 25, Dec. 17, 2001, pp. 4246-4248.

Eugene A. Fitzgerald, et al., "Mosfet Channel Engineering Using Strained Si, SiGe, and Ge Channels", Solid State Devices and Materials—International Conference, Sep. 2002.

Chris G. Van de Walle, "Theoretical Calculations of Heterojunction Discontinuities in the Si/Ge System", Physical Review B, vol. 34, No. 8, Oct. 15, 1986, pp. 5621-5634.

Koester et al., "Extremely High Transconductance Ge/Si 0.4 Ge 0.6 p-MODFET's Grown by UHV-CVD", Mar. 2000, IEEE Electron Device Letter, pp. 110-112.

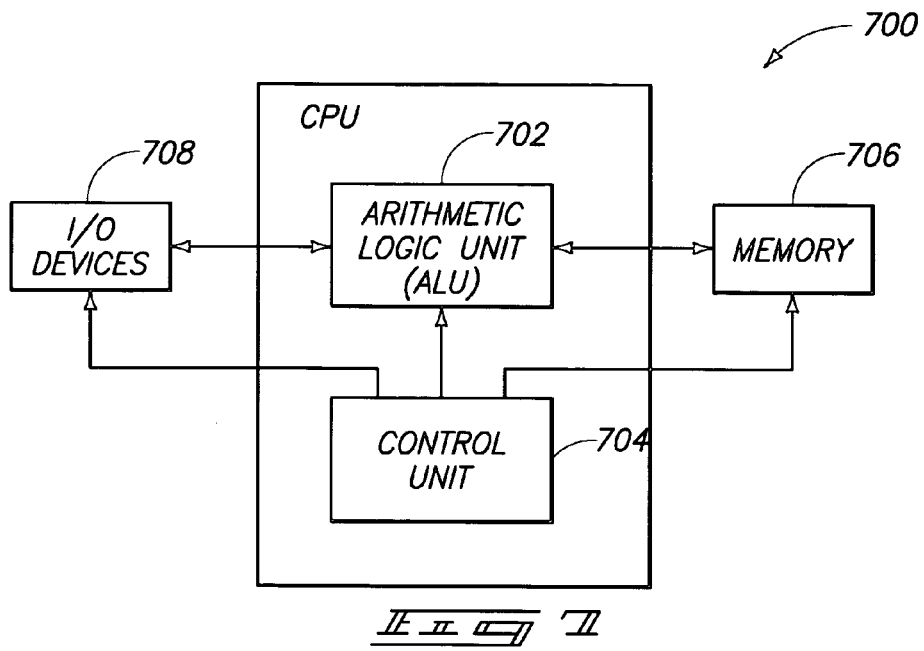
_FIG. 7_
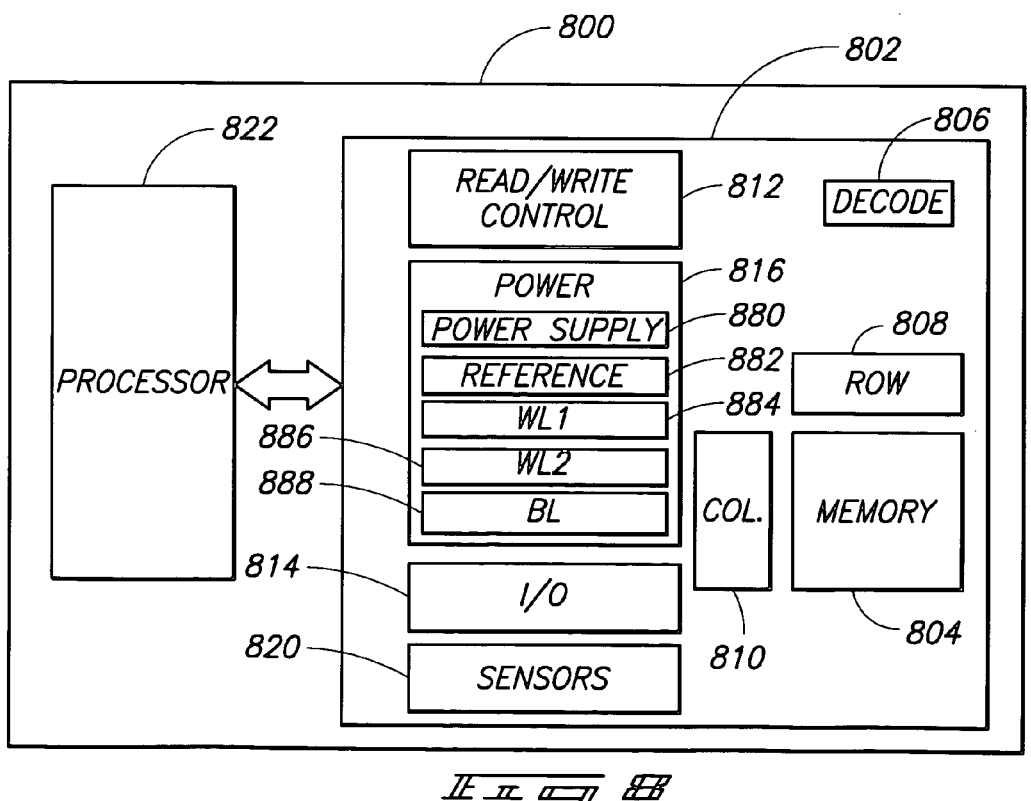
_FIG. 8_

TRANSISTOR STRUCTURES AND TRANSISTORS WITH A GERMANIUM-CONTAINING CHANNEL

RELATED PATENT DATA

This patent resulted from a continuation application of U.S. patent application Ser. No. 10/882,563, filed Jun. 30, 2004, now U.S. Pat. No. 7,151,285 and which is incorporated herein by reference.

TECHNICAL FIELD

The inventions pertain to transistor structures and transistors that include a channel containing germanium. The channel may be buried.

BACKGROUND OF THE INVENTION

Operation of semiconductor devices typically depends upon movement of charge carriers through portions of the device structure. Accordingly, the lower the mobility of charge carriers in a structural feature, the slower the device may function. One technique intended to increase charge carrier mobility includes increasing crystal lattice strain in semiconductive material. For example, conventional efforts include a variety of methods that increase tensile stress and thus increase charge carrier mobility. Other efforts to increase charge carrier mobility include substituting silicon in MOS devices with germanium. Germanium exhibits a lower band gap (0.85 eV) compared to silicon (1.1 eV), providing a higher drive current in MOS devices due to increased charge carrier mobility. However, germanium also exhibits significantly higher leakage currents and produces drain induced barrier lowering (DIBL), as known to those of ordinary skill.

Other efforts to improve transistor devices include replacement of silicon dioxide gate dielectric materials with high K gate dielectric materials. In many devices, silicon dioxide dielectric has reached its scaling limit due to leakage currents. Excessive scaling allows leakage of charge carriers through silicon dioxide gate dielectric to the gate, significantly increasing power drain and adversely affecting operation of the transistor devices. High K gate dielectric materials might be used to decrease current leakage through the gate dielectric. However, high K dielectric materials used in combination with germanium exhibit poor interface properties at the interface between the high K gate dielectric and germanium-containing channel material. The gains in charge carrier mobility when using germanium with a high K dielectric material (such as shown in FIG. 4) do not produce the expected corresponding improvement in drive current. To date, efforts attempting to integrate high K dielectric in germanium MOS devices have achieved limited success.

Accordingly, a desire exists to use germanium in transistor devices in a manner taking greater advantage of the enhanced charge carrier mobility of germanium than previously obtained. Also, a further desire exists to incorporate the advantageous characteristics of high K gate dielectric materials with the enhanced charge carrier mobility of germanium.

SUMMARY OF THE INVENTION

According to one aspect of the invention, a transistor structure includes a first undoped, silicon-comprising channel layer over a substrate, a buried channel consisting of germanium and, optionally, a dopant, the buried channel being over the first channel layer, and a second undoped, silicon-comprising channel layer over the buried channel. By way of example, the buried channel may be on and in contact with the first channel layer. Also, the second channel layer may be on and in contact with the buried channel. The second of the channel layers may consist of silicon and germanium. The first and second channel layers may consist of silicon. The structure may be comprised by a memory device.

According to another aspect of the invention, a transistor structure includes a first channel layer over a substrate, a buried channel consisting of germanium and, optionally, a dopant, the buried channel being over the first channel layer, and a second, undoped channel layer consisting of silicon and germanium over the buried channel. The buried channel exhibits charge carrier mobility greater than that of the first channel layer.

According to a further aspect of the invention, a transistor structure includes a first channel layer over a substrate, a buried channel consisting of germanium and, optionally, a dopant, the buried channel being over the first channel layer, and a second channel layer consisting of compositionally graded SiGe and, optionally, a dopant, the second channel layer being over the buried channel. The buried channel exhibits charge carrier mobility greater than that of the first channel layer.

According to a still further aspect of the invention, a transistor structure includes a first silicon layer over a substrate, an undoped or homogeneously doped buried channel containing silicon and germanium over the first channel layer, and a second silicon layer over the buried channel. By way of example, the buried channel may be undoped and consist of silicon and germanium. Also, the first and second channel layers may consist of silicon.

BRIEF DESCRIPTION OF THE DRAWINGS

Preferred embodiments of the invention are described below with reference to the following accompanying drawings.

FIG. 7 shows a high level block diagram of an electronic system according to an exemplary aspect of the present invention.

FIG. 8 shows a simplified block diagram of an exemplary device according to an aspect of the present invention.

DETAILED DESCRIPTION OF THE PREFERRED EMBODIMENTS

Figure 1:
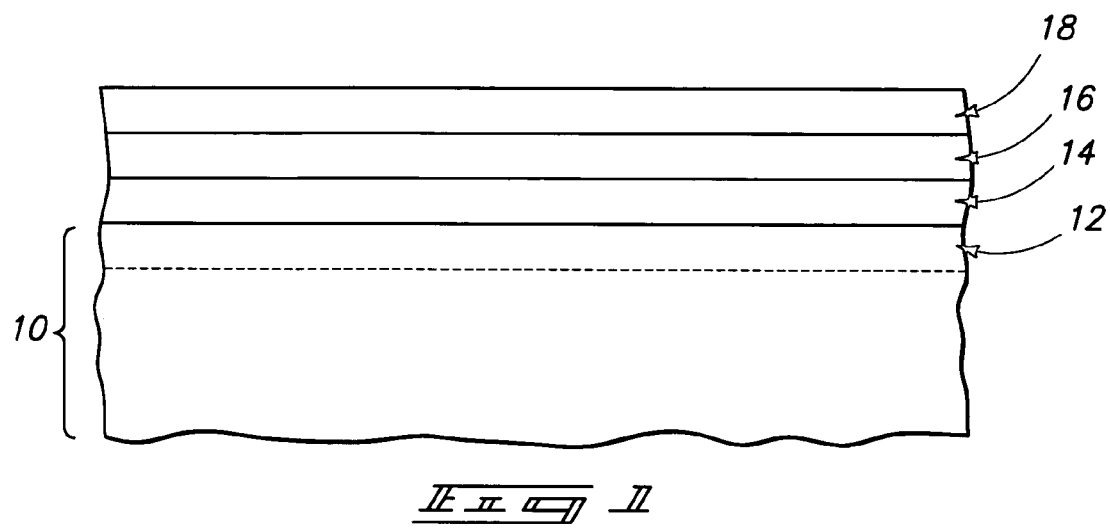
FIG. 1 is a sectional view of a portion of a device including a buried channel according to one aspect of the invention.

"Surface roughness scattering" or "scattering" in the context of the present document denotes an electron transport process whereby an electron in a particular crystal momentum state changes to a different state. Some may refer to it as a form of Coulombic scattering. Some speculation exists that high K dielectric materials produce a higher level of surface roughness scattering at the gate dielectric interface with underlying transistor channel material compared to surface roughness scattering for silicon dioxide gate dielectric on the same channel material. Scattering can hamper performance of the device. Accordingly, even though high K gate dielectric materials reduce current leakage incurred beyond the scaling limit of silicon dioxide, a reduction in surface roughness scattering may enhance performance of devices using a high K dielectric. In the context of the present document, "high K" refers to a K of greater than 3.9. Exemplary materials include $HfO_2$ (K=25), $HfO_2Si$, $HfO_2N$, $ZrO_2$ (K=25), $Al_2O_3$ (K=9), and others.

Another performance enhancement involves inclusion of germanium in transistor channels. While germanium-containing channels exhibit improved drive currents, some speculation exists that germanium may diffuse across the interface between the gate dielectric and the underlying channel material. Also, very significant trap states appear to exist at the gate dielectric interface with the channel material. Acting as electrically active defects at the interface, the trap states are capable of trapping charge carriers. Despite the surface scattering problems, trap states, and germanium diffusion at the gate dielectric interface with a germanium channel, MOS devices using germanium according to the aspects of the invention are expected to exhibit promising, improved drive currents.

The various aspects of the invention described herein may assist in countering the detrimental effects of combining high K gate dielectric material with germanium channel material and may thus produce performance gains in germanium MOS devices. The performance gains may be more commensurate with the gains in charge carrier mobility obtained by using germanium in the channel material. The various aspects of the invention may also produce performance gains in germanium MOS devices that do not use high K gate dielectric material or in other germanium-based transistors.

Improvements in drive current of a transistor channel can be partly explained mathematically as follows:

$$I_{ds} = q \times v_{injection} \quad \text{(Equation 1)}$$

where $I_{ds}$ is channel current, q is charge, and $v_{injection}$ is transistor source injection velocity. "Charge" may be modified in Equation 1 to produce Equation 2:

$$I_{ds} = C_{ox} \times \text{Gate Overdrive} \times v_{injection} \quad \text{(Equation 2)}$$

where $C_{ox}$ is gate capacitance. Equation 2 may be modified to produce Equation 3:

$$I_{ds} = C_{ox} \times (V_{gs} - V_t) \times v_{injection} \quad \text{(Equation 3)}$$

showing that gate overdrive is simply the difference between gate-source voltage ($V_{gs}$) and threshold voltage ($V_t$). Final modification to produce Equation 4:

$$I_{ds} = C_{ox} \times (V_{gs} - V_t) \times E_{source} \times \mu_{injection} \quad \text{(Equation 4)}$$

where $E_{source}$ is electric field at the source and $\mu_{injection}$ is charge carrier mobility, displays in mathematical form some of the relationships discussed above. Namely, increasing gate capacitance ($C_{ox}$) with high K dielectric material increases channel current ($I_{ds}$). Also, increasing charge carrier mobility ($\mu_{injection}$) increases channel current. The increase in charge carrier mobility thus allows further scaling, reduces contact resistance, and lowers external resistance. As known to those of ordinary skill, "external resistance" refers to the resistance along a current path extending up to the transistor channel. In the context of the present document, external resistance includes contact resistance, plug or silicide resistance, diffusion region resistance, and spreading resistance in the overlap region (lightly doped drain). This demonstrates the desirability of using high K dielectric material and germanium channel material in transistors were it not for the surface scattering problems, trap states, germanium diffusion, and perhaps other problems encountered.

Nevertheless, the various aspects of the invention address problems associated with germanium-containing channels and/or high K dielectric materials. According to one aspect of the invention, a transistor structure includes a first undoped, silicon-comprising channel layer over a substrate, a buried channel over the first channel layer, and a second undoped, silicon-comprising channel layer over the buried channel. The buried channel consists of germanium except that it may be doped or, preferably, undoped.

In the context of the present document, "undoped" refers to a material having a dopant content of less than about $1 \times 10^{15}$ atom/centimeter$^3$ (atom/cm$^3$). "Dopants" refers to impurities intentionally added to a material. "Impurities" refers to dopants as well as elements unintentionally added to a material. For example, conductivity enhancing "dopants" are frequently added to semiconductive material. A variety of "doping" techniques are known to those of ordinary skill. Also, while high purity materials are often desired, unintentional "impurities" may nevertheless accumulate in materials, usually with detrimental effect depending upon the degree of contamination. While preferably undoped, those of ordinary skill may choose to dope the buried channel (or other components) to provide some desired physical property.

It is an advantage of the described transistor structure that it includes the germanium-containing buried channel between first and second silicon-comprising channel layers. In this manner, the difficulties associated with germanium-containing channels can be addresses by selecting suitable compositions for the first and/or second undoped, silicon-comprising channel layers. For example, at least the second of the undoped channel layers can consist of silicon and germanium. Further, at least one of the first and second channel layers may consist of compositionally graded SiGe having a higher Ge content at an interface with the buried channel in comparison to other portions of the first and second channel layers. As an alternative, the first and second channel layers may consist of silicon. The first and second channel layers can have thicknesses of from about 100 Angstroms to about 600 Angstroms. The buried channel can have a thickness of from about 300 Angstroms to about 600 Angstroms.

As an example, the buried channel may exhibit charge carrier mobility greater than that of both the first and second channel layers. The buried channel may be on and in contact with the first channel layer. The second channel layer may be on and in contact with the buried channel. The substrate may include a semiconductor-on-insulator (SOI) substrate. The substrate can instead include a bulk silicon wafer.

In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

The transistor structure may further include a gate dielectric layer having a K greater than 3.9 over the second channel layer. The gate dielectric layer may have a K greater than about 10. The transistor structure may further include a gate over the second channel layer and a source and a drain in electrical connection with the buried channel. A thin buffer layer of from about 5 to about 10 Angstroms thickness may be provided between the gate dielectric layer and the second channel layer. The buffer layer may contain $SiO_2$ and have a K of about 3.9. The buffer layer may assist in further minimizing surface roughness scattering and improving charge carrier mobility.

Figure 2:
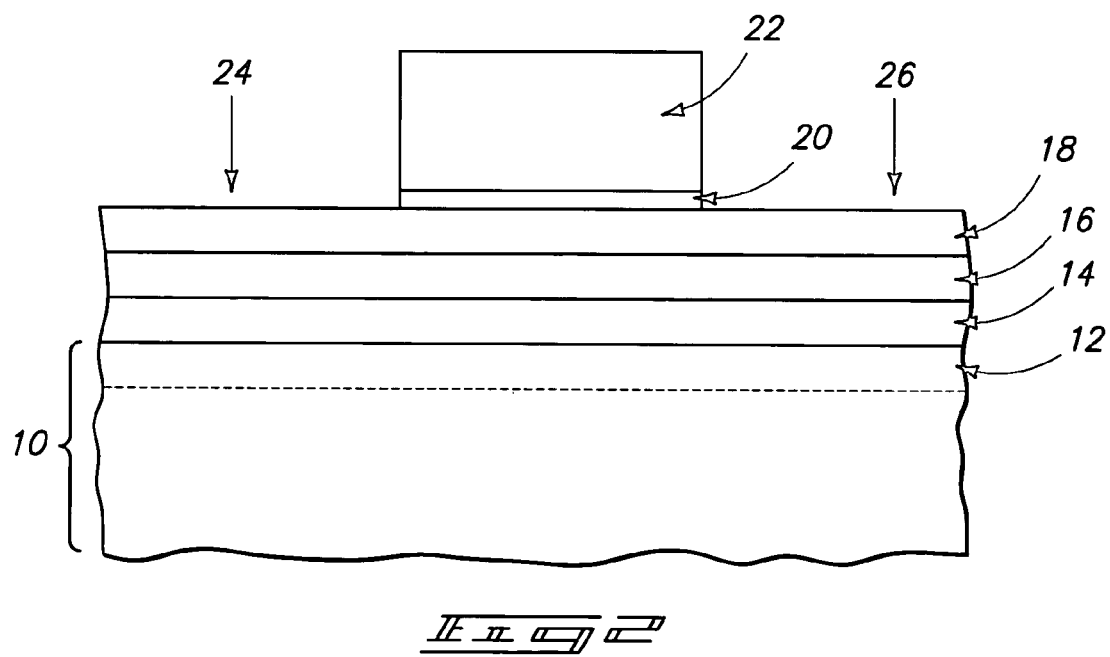
FIG. 2 is a sectional view of the device portion shown in FIG. 1 with an added gate dielectric and gate according to another aspect of the invention.

FIG. 1 shows series of layers formed over substrate 10. Notably, a substrate 10 may include some number of optional layer(s), represented in FIG. 1 as optional layer 12, in accordance with the knowledge of those of ordinary skill. A first channel layer 14 is over substrate 10, a buried channel 16 is over first channel layer 14, and a second channel layer 18 is over buried channel 16. In FIG. 2, a gate dielectric 20 is over second channel layer 18 and a gate 22 is over gate dielectric 20. A source region 24 and a drain region 26 may be operationally proximate gate 22 and buried channel 16, in accordance with conventional configurations. Understandably, the buried channel transistor structure may be incorporated into a variety of conventional devices other than specifically shown in FIG. 2. Buried channel 16 may overcome difficulties associated with germanium-containing channels and take greater advantage of the enhanced charge carrier mobility of germanium. Also, buried channel 16 may overcome difficulties associated with incorporating the advantageous characteristics of high K gate dielectric materials with germanium-containing channels.

Although a variety of more specific embodiments are conceivable in accordance with the aspects of the invention described herein, a few stand out as particularly advantageous. For respective first channel layer, buried channel, and second channel layer, a Si/Ge/Si or SiGe/Ge/SiGe stack are possibilities. If the first or second undoped, silicon-comprising channel layer includes compositionally graded SiGe, then conventional methods may be used to form the layer with a composition reflected by the formula $Si_xGe_{1-x}$, where x varies across a thickness of the first or second channel layer.

Figure 3:
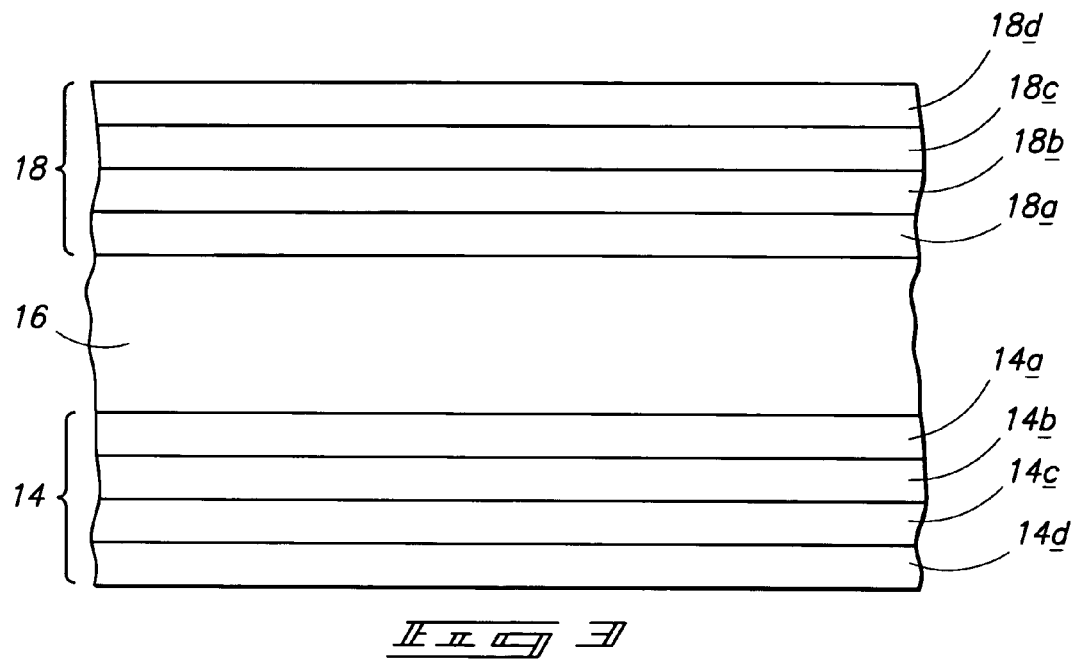
FIG. 3 is an enlarged sectional view of selected structural features from FIG. 1 showing compositional grading according to a further aspect of the invention.
Figure 4:
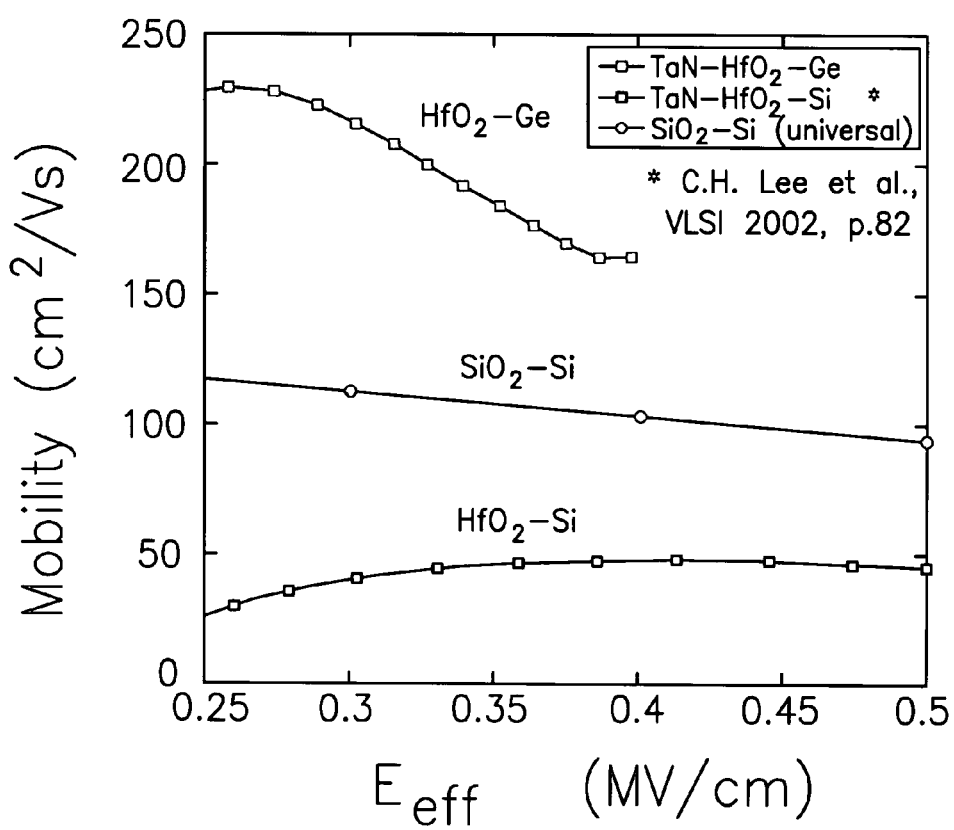
FIG. 4 is a chart showing measured hole mobility for silicon with $HfO_2$ gate dielectric/TaN gate (from Lee, et al., "Self-Aligned Ultra Thin $HfO_2$ CMOS Transistors with High Quality CVD TaN Gate Electrode," IEEE 2002 Symposium On VLSI Technology, pg. 82-83) compared to silicon with $SiO_2$ gate dielectric (universal mobility curve) and germanium with $HfO_2$ gate dielectric/TaN gate.

FIG. 3 shows one example of compositional grading where first channel layer 14 and second channel layer 18 include four discrete layers, each with a different composition. Atomic layer deposition (ALD) is capable of forming monolayers with a single atom or molecule thickness. ALD and perhaps other known techniques may be used to form the FIG. 3 structures or similar structures described herein. As one possibility, layers 14a and 18a may have a composition described by the formula $Si_xGe_{1-x}$ where x is 0.25. Layers 14b and 18b may have a composition where x is 0.5, layers 14c and 18c may have a composition where x is 0.75 and layers 14d and 18d may have a composition where x is 1. Accordingly, x may be from 0 to 1. Each of the four discrete layers that comprise first channel layer 14 and second channel layer 18 may be monolayers or multiple monolayers. Understandably, first channel layer 14 and second channel layer 18 may include at least two sub-layers of discretely different compositions.

In accordance with the various embodiments, buried channel 16 thus may offer a low resistance path for charge carriers between first channel layer 14 and second channel layer 18 while diminishing the problem of trap states and germanium diffusion associated with germanium-containing channels. Buried channel may also diminish the problem of surface roughness scattering associated with a high K dielectric-to-germanium interface. Conventional doping and engineering of the germanium mole fraction in first channel layer 14 and second channel layer 18 can assist in controlling drain induced barrier lowering.

According to another aspect of the invention, a transistor structure includes a first channel layer over a substrate, a buried channel layer over the first channel layer, and a second, undoped channel layer consisting essentially of silicon and germanium over the buried channel. The buried channel consists of germanium and, optionally, a dopant and exhibits charge carrier mobility greater than that of the first channel layer. As one example, the buried channel may consist of germanium (thereby being undoped). The first channel layer may consist of silicon, germanium, and, optionally, a dopant.

According to a further aspect of the invention, a transistor structure includes a first channel layer over a substrate, a buried channel over the first channel layer, and a second channel layer over the buried channel. The buried channel consists of germanium and, optionally, a dopant and exhibits charge carrier mobility greater than that of the first channel layer. The second channel layer consists of compositionally graded SiGe and, optionally, a dopant. As one example, the first channel layer may consist of silicon, germanium, and, optionally, a dopant. The buried channel may consist of germanium and both the first and second channel layers may be undoped. Preferably, both the first and second channel layers are doped.

According to a still further aspect of the invention, a transistor includes a first channel over a substrate, a buried channel consisting of germanium on and in contact with the first channel layer, and a second channel layer on and in contact with the buried channel. The first and second channel layers consist of compositionally graded SiGe and, optionally, a dopant. The first and second channel layers have higher Ge content at an interface with the buried channel in comparison to other portions of the first and second channel layers. The buried channel exhibits charge carrier mobility greater than that of both the first and second channel layers. The transistor further includes a gate dielectric layer having a K greater than 3.9 over the second channel layer, a gate over the gate dielectric layer, and a source and a drain in electrical connection with the buried channel. As an example, dopants in the first channel layer need not be the same as dopants in the second channel layer, but may be the same.

Significant advantages may exist in providing a germanium channel between first and second channel layers containing doped, compositionally graded SiGe. Without being limited to any particular theory, it is believed that very high vertical electrical fields, typically present when using a high K gate dielectric, quantize the charge carriers within the inversion region of the transistor channel. The inversion region forms where the concentration of minority charge carriers exceeds that of majority charge carriers, typically in the channel near the interface with the gate dielectric. In the present aspect of the invention, the inversion region can thus form in the graded SiGe where the Ge content provides improved minority carrier mobility in comparison to Si, creating 2D electron gas.

Also, at least two sub-bands are expected to form in the graded SiGe. Such sub-bands form more readily in SiGe compared to Si. The lower sub-band provides a lower effective mass for charge carriers, enabling very high mobility and allowing ballistic, or close-to-ballistic, charge carrier transport. Sub-band formation is believed to occur as a result of shifting the X-minima of the Brillouin zone symmetry point closer to the Γ-point in the band structure. (As known to those of ordinary skill, crystal properties of silicon may be described in terms of a Brillouin zone having planes that define the location of the band gap. The Brillouin zone exhibits major symmetry points, such as the X symmetry point. In a graphical depiction of band structure (energy-momentum dispersion relationship) in silicon, the X symmetry point corresponds to conduction band minima, or X-minima. The Γ-point corresponds to valence band maxima.)

Further, the wave function of charge carriers is believed to go to zero near the graded SiGe/gate dielectric interface due to the charge carrier quantization mentioned above. Accordingly, charge carriers from the transistor source can be pushed further into the buried channel structure. The germanium buried channel may be formed at a distance from the transistor source that maximizes injection velocity into the channel region, leading to high drive currents. Preferably, a distance from a gate dielectric/channel interface to the germanium buried channel is from about 50 to about 100 Angstroms. As is apparent from the discussion above, the carrier quantization, sub-band formation, and increased injection velocity attainable with the graded SiGe/Ge/graded SiGe structure contribute to significant performance improvements.

In addition, dopant engineering of the graded SiGe under the buried channel can assist in confining charge carriers close to the buried channel. Conventionally, dopant implants create a dopant profile through an elevational thickness of the implanted material. Dopant concentration as a function of depth into the implanted material can form a Gaussian (normal) distribution or Pearson (skewed) distribution. In either case, the peak dopant concentration and width of the distribution (i.e., depth into the material) may be engineered by varying dose and energy using conventional techniques. In the aspects of the present invention, the dopant profile may reach its peak within the buried channel and drop-off on each side of the peak to a sufficient degree such that conduction of charge carriers through the buried channel instead of the first and/or second channel layer is significantly favored. This dopant condition can advantageously influence a device's on and off characteristics.

Providing graded SiGe as the second channel layer may create important advantages in comparison to SiGe of uniform composition throughout an elevational thickness of the second channel layer. If gate dielectric is formed on the second channel layer containing compositionally uniform SiGe, then the quality of gate dielectric/channel interface depends upon the uniform SiGe. In this circumstance, additional Ge content increasingly degrades the interface quality. Typically, the density of interface trap states, surface roughness, etc. worsens with additional Ge content. By comparison, graded SiGe can minimize the trap density, surface roughness, etc. As indicated above, the graded SiGe composition may be reflected by the formula $Si_xGe_{1-x}$, where x varies across a thickness of the second channel layer. The value for x may be 1 at the gate dielectric/channel interface, providing an interface quality similar to that of silicon channel. Even if the value for x is less than 1 at the interface, x may be selected to provide a better quality interface compared to uniform SiGe with higher Ge content.

The embodiments discussed thus far address a buried channel consisting of germanium and optional dopants. However, aspects of the invention also include an undoped or homogeneously doped buried channel containing both silicon and germanium. Accordingly, in one aspect of the invention a transistor structure includes a first silicon layer over a substrate, an undoped or homogeneously doped buried channel containing silicon and germanium over the first channel layer, and a second silicon layer over the buried channel.

The variations in such a transistor structure are similar to those described above for a buried channel consisting of germanium and optional dopants. For example, the buried channel may exhibit charge carrier mobility greater than that of both the first and second silicon layers. The buried channel is preferably undoped. The buried channel may be on and in contact with the first channel layer. The second channel layer may be on and in contact with the buried channel. The first and second channel layers may consist of silicon. The first and second channel layers may have thicknesses of from about 100 Angstroms to about 600 Angstroms. The buried channel may have a thickness of from about 300 Angstroms to about 600 Angstroms. The substrate may include a SOI substrate. The substrate may instead include a bulk silicon wafer.

In the circumstance where the transistor structure further includes a high K gate dielectric layer over the second channel layer, it is advantageous to provide the second silicon layer between the gate dielectric layer and the buried channel including silicon and germanium. The advantages are similar to those described herein for a second channel layer between a buried channel including germanium and a high K gate dielectric layer. Even for a buried channel including silicon and germanium, the second silicon layer addresses the problems of trap states and germanium diffusion at the gate dielectric interface with a germanium-containing channel. The second silicon layer also addresses the problem of surface roughness scattering at a high K dielectric interface with a germanium-containing channel. Understandably, surface roughness scattering may be less of a problem given the partial silicon content of the buried channel. Preferably, the buried channel including silicon and germanium exhibits a composition of $Si_yGe_{1-y}$, where y is from 0.2 to 0.8 or, preferably, from 0.3 to 0.5.

In another aspect of the invention, a transistor includes a first channel layer over a substrate, an undoped or homogeneously doped buried channel on and in contact with the first channel layer, and a second channel layer on and in contact with the buried channel. The first and second channel layers consist of silicon and, optionally, a dopant. The buried channel consists of silicon and germanium aside from the dopants, if any. The transistor includes a gate dielectric layer having a K greater than 3.9 over the second channel layer, a gate over the gate dielectric layer, and a source and a drain in electrical connection with the buried channel. The buried channel exhibits charge carrier mobility greater than that of both the first and second channel layers.

At least three embodiments of the aspects of the invention stand out as being of a particular advantage. In a first embodiment, a first channel layer, buried channel, and second channel layer respectively include SiGe/Ge/SiGe, where at least the second of the channel layers may be compositionally graded, undoped, or both. In a second embodiment, the respective layers include Si/Ge/Si. In a third embodiment, the respective layers include Si/SiGe/Si, where the buried channel is undoped or homogeneously doped, that is, does not rely upon modulation doping.

Figure 5:
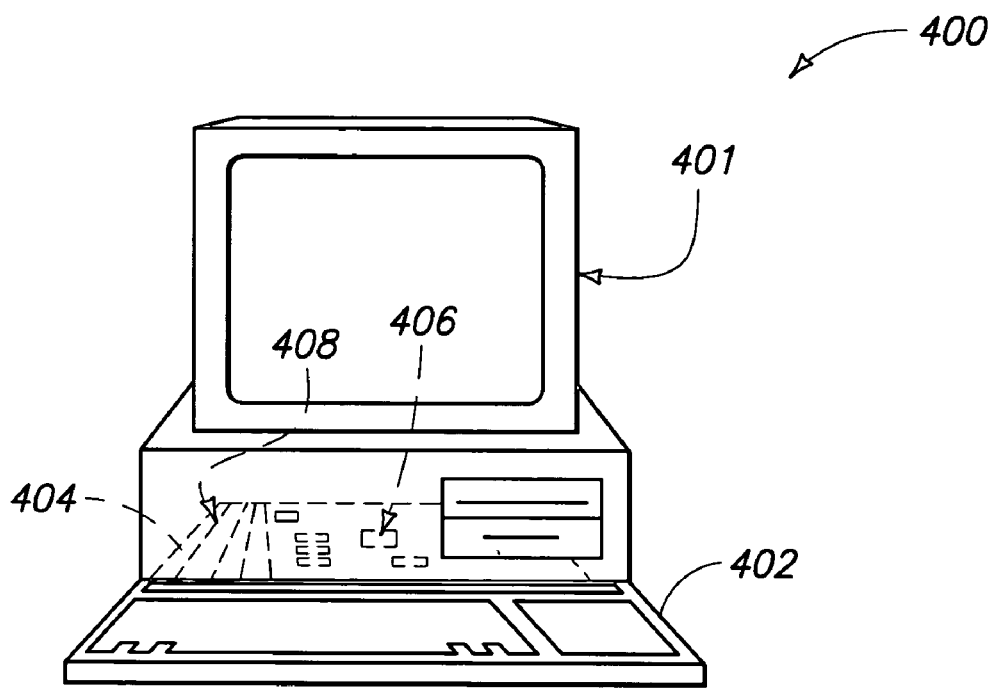
FIG. 5 shows a diagrammatic view of computer illustrating an exemplary application of the present invention.
Figure 6:
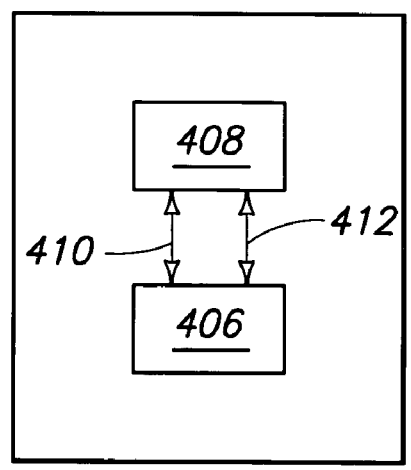
FIG. 6 is a block diagram showing particular features of the motherboard of the FIG. 6 computer.

FIG. 5 illustrates generally, by way of example, but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 6. In such block diagram, the addressing circuitry is illustrated as 410 and the read circuitry is illustrated as 412.

In particular aspects of the invention, memory device 408 can correspond to a memory module. For example, single in-line memory modules (SIMMs) and dual in-line memory modules (DIMMs) may be used in the implementation that utilizes the teachings of the present invention. The memory device can be incorporated into any of a variety of designs that provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory that allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

FIG. 7 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include DRAM cells in accordance with various aspects of the present invention.

FIG. 8 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bitline with pulses. The system 800 also includes a processor 822, or memory controller for memory accessing.

The memory device 802 receives control signals 824 from the processor 822 over wiring or metallization lines. The memory device 802 is used to store data that is accessed via I/O lines. It will be appreciated by those skilled in the art that additional circuitry and control signals can be provided, and that the memory device 802 has been simplified to help focus on the invention. At least one of the processor 822 or memory device 802 can include a capacitor construction in a memory device of the type described previously herein.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of ordinary skill in the art will understand that the various electronic systems can be fabricated in single-package processing units, or even on a single semiconductor chip, in order to reduce the communication time between the processor and the memory device(s).

Applications for memory cells can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A transistor structure comprising:
   a first undoped channel layer consisting of compositionally graded SiGe, the first channel layer being over a substrate;
   a buried channel consisting of germanium and, optionally, a dopant, the buried channel being over the first channel layer, the SiGe having a higher Ge content at an interface with the buried channel in comparison to all other portions of the first channel layer;
   a second undoped, silicon-comprising channel layer over the buried channel;
   a gate dielectric layer having a K greater than 3.9 on and in contact with the second channel layer, a distance from a gate dielectric layer/second channel layer interface to the germanium buried channel being from greater than 50 to about 100 Angstroms;
   a gate over the gate dielectric layer; and a source and a drain in electrical connection with the buried channel.

2. The structure of claim 1 wherein the buried channel exhibits a charge carrier mobility greater than that of both the first and second channel layers.

3. The structure of claim 1 wherein the buried channel consists of germanium.

4. The structure of claim 1 wherein the buried channel is on and in contact with the first channel layer.

5. The structure of claim 1 wherein the second channel layer is on and in contact with the buried channel.

6. The structure of claim 1 wherein at least the second of the channel layers consists of silicon and germanium.

7. The structure of claim 1 wherein the second channel layer consists of silicon.

8. The structure of claim 1 wherein the second channel layer consists of compositionally graded SiGe having a higher Ge content at an interface with the buried channel in comparison to other portions of the second channel layer.

9. The structure of claim 1 wherein the first and second channel layers have thicknesses of from about 100 Å to about 600 Å.

10. The structure of claim 1 wherein the buried channel has a thickness of from about 300 Å to about 600 Å.

11. The structure of claim 1 wherein the substrate comprises a SOI substrate.

12. The structure of claim 1 wherein the substrate comprises a bulk silicon wafer.

13. The structure of claim 1 comprised by a memory device.

14. A transistor comprising:
a first channel layer consisting of compositionally graded SiGe and, optionally, a dopant, the first channel layer being over a substrate;
a buried channel consisting of germanium on and in contact with the first channel layer;
a second channel layer consisting of compositionally graded SiGe and, optionally, a dopant, the second channel layer being on and in contact with the buried channel, the first and second channel layers having a higher Ge content at an interface with the buried channel in comparison to all other portions of the first and second channel layers, and the buried channel exhibiting a charge carrier mobility greater than that of both the first and second channel layers;
a gate dielectric layer having a K greater than 3.9 on and in contact with the second channel layer, a distance from a gate dielectric layer/second channel layer interface to the germanium buried channel being from greater than 50 to about 100 Angstroms;
a gate over the gate dielectric layer; and
a source and a drain in electrical connection with the buried channel.

15. A transistor comprising:
a first channel layer consisting of silicon and, optionally, a dopant, the first channel layer being over a substrate;
an undoped or homogeneously doped buried channel otherwise consisting of silicon and germanium on and in contact with the first channel layer; and
a second channel layer consisting of silicon and, optionally, a dopant, the second channel layer being on and in contact with the buried channel and the buried channel exhibiting a charge carrier mobility greater than that of both the first and second channel layers;
a gate dielectric layer having a K greater than 3.9 on and in contact with the second channel layer, a distance from a gate dielectric layer/second channel layer interface to the buried channel being from greater than 50 to about 100 Angstroms;
a gate over the gate dielectric layer; and
a source and a drain in electrical connection with the buried channel.

16. A transistor structure comprising:
a first undoped channel layer consisting of silicon over a substrate;
a buried channel consisting of germanium and, optionally, a dopant other than silicon, the buried channel being on and in contact with the first channel layer; and
a second undoped channel layer consisting of silicon on and in contact with the buried channel.

17. A transistor structure comprising:
a first undoped, silicon-comprising channel layer over a substrate;
a buried channel consisting of germanium and, optionally, a dopant, the buried channel being over the first channel layer;
a second undoped, silicon-comprising channel layer having a uniform composition on and in contact with the buried channel;
a gate dielectric layer having a K greater than 3.9 on and in contact with the second channel layer, a distance from a gate dielectric layer/second channel layer interface to the germanium buried channel being from greater than 50 to about 100 Angstroms;
a gate over the gate dielectric layer; and
a source and a drain in electrical connection with the buried channel.

* * * * *